(12) United States Patent
Fahrbach et al.

(10) Patent No.: US 7,089,142 B2
(45) Date of Patent: Aug. 8, 2006

(54) METHOD AND DEVICE FOR MONITORING THE FUNCTION OF AN OUTPUT STAGE HAVING PULSE WIDTH MODULATION

(75) Inventors: Wilhelm Fahrbach, Bietigheim (DE); Juergen Gladow, Stuttgart (DE); Karl-Heinz Gyoerfi, Weil der Stadt (DE); Udo Weyhersmueller, Leonberg-Hoefingen (DE)

(73) Assignee: Robert Bosch GmbH, Stuttgart (DE)

( * ) Notice: Subject to any disclaimer, the term of this patent is extended or adjusted under 35 U.S.C. 154(b) by 7 days.

(21) Appl. No.: 10/450,766

(22) PCT Filed: Dec. 5, 2001

(86) PCT No.: PCT/DE01/04568

§ 371 (c)(1),
(2), (4) Date: Mar. 1, 2004

(87) PCT Pub. No.: WO02/48721

PCT Pub. Date: Jun. 20, 2002

(65) Prior Publication Data

US 2004/0130354 A1 Jul. 8, 2004

(30) Foreign Application Priority Data

Dec. 14, 2000 (DE) ................ 100 62 190

(51) Int. Cl.
*G06F 3/01* (2006.01)
(52) U.S. Cl. ............. 702/124; 702/189; 702/190; 702/199

(58) Field of Classification Search ............ 702/57, 702/61, 65, 182, 189–191, 193, 124, 199; 318/268; 341/144; 356/432; 700/209, 294, 700/296
See application file for complete search history.

(56) References Cited

U.S. PATENT DOCUMENTS

| 5,465,011 A | * | 11/1995 | Miller et al. ............ 307/64 |
| 5,497,332 A | * | 3/1996 | Allen et al. ............ 700/295 |
| 5,859,527 A | * | 1/1999 | Cook ............ 323/298 |
| 6,825,644 B1 | * | 11/2004 | Kernahan et al. ............ 323/283 |
| 6,831,431 B1 | * | 12/2004 | Dieterle et al. ............ 318/268 |

FOREIGN PATENT DOCUMENTS

| DE | 39 21 329 | 1/1991 |
| DE | 40 12 109 | 10/1991 |
| DE | 198 51 732 | 5/1999 |
| DE | 199 28 135 | 9/2000 |
| DE | 199 15 593 | 11/2000 |
| EP | 0 813 069 | 12/1997 |
| JP | 01 264 571 | 10/1989 |

* cited by examiner

*Primary Examiner*—Marc S. Hoff
*Assistant Examiner*—Felix Suarez
(74) *Attorney, Agent, or Firm*—Kenyon & Kenyon LLP

(57) ABSTRACT

A method and a device for monitoring at least one output stage which is actuated by a microcontroller using an input signal having any pulse duty factor. The output signal from the output stage is averaged by an electrical circuit and compared to a setpoint value which is calculated from the input signal of the output stage. An error in the output stage is diagnosed when the averaged value deviates from the calculated setpoint value.

16 Claims, 1 Drawing Sheet

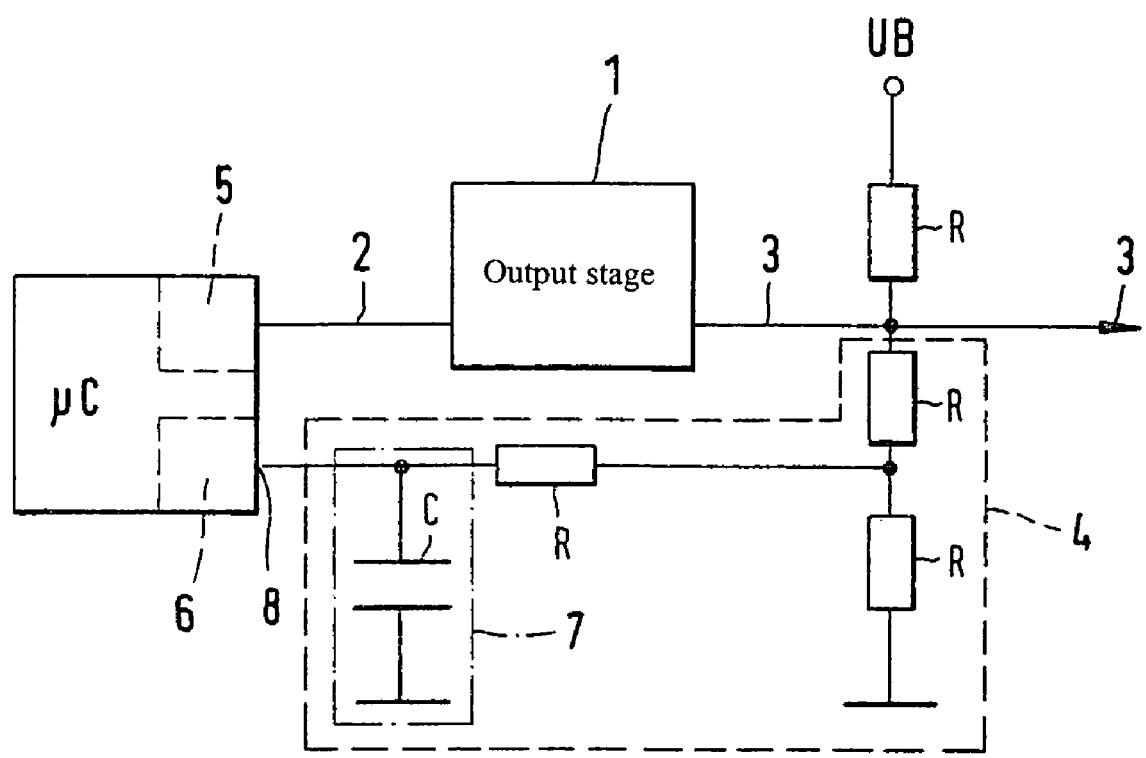

METHOD AND DEVICE FOR MONITORING THE FUNCTION OF AN OUTPUT STAGE HAVING PULSE WIDTH MODULATION

FIELD OF THE INVENTION

Output stages having pulse width modulation are widely used in the actuation of electrical consumers, such as actuators in motor vehicle engines or in industrial facilities. Output stages supply the power required by the consumers. Errors such as load drop, short circuit to ground, or short circuit to the positive potential, for example, may arise in the output stages. For this reason there is a need for a simple and accurate method of detecting the errors.

BACKGROUND INFORMATION

German Published Patent Application No. 40 12 109 relates to a device for monitoring the function of an electrical consumer, its output stage, its actuation, and the associated connections. Parallel to the output stage, an error detection logic circuit is connected which distinguishes between the following possible types of error: short circuit to ground, short circuit to the positive potential, and load drop, using a hardware-based comparison of the input and output potentials and using a reference potential.

German Published Patent Application No. 198 51 732 relates to a method and a device for monitoring at least one current control level for an electrical consumer. The current control level has at least one switching element and one current controller. A current which is specified by a pulse duty factor flows through the consumer, it being possible for the current controller to set the current to a setpoint value. To monitor the current control levels, the pulse duty factor and/or a variable derived from the pulse duty factor are compared to a threshold value, and an error is detected when there is a deviation from this value. The threshold value results from the particular corresponding variable which is present in at least one of the other current control levels. The ratio of the time in which the switching element is closed to the entire duration of actuation is referred to as the pulse duty factor. However, the ratio of the time in which the switching element is closed to the time in which the switching element is open, for example, may also be used.

Thus far, primarily two possibilities for monitoring the function of output stages having pulse width modulation (PWM) have been used in the related art: evaluating the status output from the intelligent output stage, or determining the status by feedback from the output stage output to a digital port. Neither possibility is suited for the active PWM operation. In the evaluation of the status signal from the intelligent output stage, the instantaneous status is first delivered on a delayed basis, the delay being specific to the output stage and possibly being greater than 1 ms, for example. During feedback to a digital input, the output signal must be scanned exactly at a specific point in time. This is achievable only with high computing power, up to the system-dependent limitations. When the two cited possibilities for monitoring the function of PWM output stages are used, it is possible to scan the output signal at the correct time only when the operating time from actuation of an output stage to the effect of the control signal at the output stage output is known.

SUMMARY OF THE INVENTION

The main advantages achievable by the approach according to the present invention are that the monitoring of an output stage requires less computing power, such as for example the synchronous scanning during digital feedback of the output stage output. In addition, it is possible to monitor at any time, even when the output stage is in active operation. Furthermore, the electrical components necessary for monitoring are economical, standard components such as resistors and capacitors, for example. An additional advantage of the present invention is that the above-mentioned operating times during actuation are equalized by averaging.

The method according to the present invention and the device according to the present invention for monitoring output stages are suited for output stages which are actuated by a microcontroller using a signal having any pulse duty factor, preferably for output stages having pulse width modulation (PWM). Using the present invention, diagnosis is possible for PWM high side output stages as well as for PWM low side output stages, independent of the frequency at which they are actuated. The actuation frequency is limited only by the switching times of the output stages.

In the present invention, the output signal from the output stage is averaged by an electrical circuit and compared to a setpoint value which is calculated from the input signal of the output stage. In the averaging of the output signal it is advantageous that the operating time from the actuation of the output stage to the effect of the actuating signal is equalized, and that the output stage may be diagnosed at any time. An error is diagnosed when the averaged value deviates from the calculated setpoint value. During trouble-free operation, both values (within a tolerance range) are equal. One advantage of the method, in which the two values to be compared result from the input signal and the output signal from one output stage, is that no additional output stage need be used for comparative values, so that the diagnosis is performed completely independently from other output stages.

The output signal from the output stage to be monitored is averaged in the present invention by using an electrical circuit which has at least one resistor and at least one filter, preferably a resistor network and one filter. The filter is preferably a low-pass filter which particularly preferably contains a capacitor. The advantage of these passive components (resistors and capacitors, for example) is that they are economical due to being standard components. The capacitance of the capacitors is preferably selected in such a way that the output signal from the output stage is smoothed out at a given switching frequency of the monitored output stage. The resistors in the resistor network are preferably dimensioned so that in no-load operation of the output stage a voltage value that is ¼ to ¾ of the battery voltage, preferably ½ of the battery voltage, results at the output of the output stage, and the entire operating range of the output stage is represented at the analog input of the microcontroller.

In one embodiment of the present invention, the value which is averaged by the electrical circuit is fed back to an analog input of the microcontroller, resulting in a specific voltage which depends on the pulse duty factor. The advantage of feedback to an analog input as compared to a digital input is that the output signal need not be scanned at a precise point in time, thus saving computing power. To calculate a setpoint value for comparing to this voltage, the microcontroller actuating signal is averaged by a software simulation of the feedback according to the present invention. In other words, software simulates the output stage and the electrical circuit, and calculates the circuit output signal which is expected for the output stage input signal having any pulse duty factor. When an error occurs, it is possible to deduce the type of error, based on the amount by which the value averaged by the circuit deviates from the calculated setpoint value.

BRIEF DESCRIPTION OF THE DRAWING

FIG. 1 shows the design of a device for monitoring an output stage.

DETAILED DESCRIPTION

FIG. 1 shows one possible embodiment of the device according to the present invention for monitoring a PWM high side output stage which may be used in the method according to the present invention.

PWM high side output stage 1 having any pulse duty factor is actuated by microcontroller μC. For diagnosing output stage 1, output signal 3 from the output stage is fed back to an analog input 8 of microcontroller μC via a resistor network R and a filter 7.

Resistors R in circuit 4 are dimensioned in such a way, for example, that in no-load operation a voltage results at output 3 of output stage 1 that is ½ that of battery voltage UB.

In the embodiment of the present invention illustrated in FIG. 1, a low-pass filter containing a capacitor C is used as filter 7. The capacitance of capacitor C is selected in such a way that output signal 3 from output stage 1 is smoothed out at the switching frequency present at the output stage.

Depending on the pulse duty factor, a voltage at analog input 8 of microcontroller μC is present as output signal 6 from circuit 4. This voltage 6 is compared to a setpoint value 5. Setpoint value 5 is calculated by software simulation of the feedback in microcontroller μC. Output stage 1 and circuit 4 are simulated for averaging output signal 3 from output stage 1, and circuit output signal 6 which is expected for output stage input signal 2 is calculated. Calculated setpoint value 5 is compared to output signal 6 which is averaged by circuit 4. If the two values are equal (within a tolerance range), output stage 1 is operating properly. When an error occurs, averaged value 6 deviates from setpoint value 5. Based on the magnitude of this deviation, it is possible to deduce the type of error.

If measured value 6 is less than calculated 5, a short circuit to ground is diagnosed. If value 6 is greater than calculated 5, either a load drop or a short circuit to battery voltage UB is present. These two errors may be distinguished after switching off the output stage. The voltage which is then read back corresponds (in this embodiment) to ½ that of battery voltage UB during a load drop. If the voltage read back is much greater than this value, the error that occurred is a short circuit to battery voltage UB. It is particularly preferred that the resistors are dimensioned so that, as in this example, in no-load operation at the output of the output stage is ½ that of battery voltage UB, since this no-load voltage is particularly far removed from the two limits of 0V at ground and battery voltage UB. It is thus possible to determine the above-mentioned errors in the simplest manner, since the measured voltages are limited by tolerances which, due to this greatest possible difference from the limits, do not overlap with other tolerance bands. The particular defect may thus be accurately detected.

LIST OF REFERENCE NUMBERS

1 Output stage
2 Input signal of output stage having any pulse duty factor
3 Output signal from output stage
4 Circuit for averaging
5 Calculated setpoint value
6 Averaged value (output signal from circuit)
7 Filter
8 Analog input of microcontroller
C Capacitor
μC Microcontroller
R Resistor
UB Battery voltage

The invention claimed is:

1. A method for monitoring at least one output stage, comprising:
   causing a microcontroller to actuate the at least one output stage using an input signal having a pulse duty factor;
   causing an electrical circuit to average an output signal of the at least one output stage in order to produce an averaged value;
   calculating a setpoint value from the input signal; and
   comparing the averaged value to the setpoint value, wherein:
   a deviation of the averaged value from the setpoint value indicates an error.

2. The method as recited in claim 1, further comprising:
   feeding back the averaged value to an analog input of the microcontroller.

3. The method as recited in claim 1, wherein:
   the averaging by the electrical circuit is carried out using at least one resistor and at least one filter.

4. The method as recited in claim 1, wherein:
   the calculating of the setpoint value is performed by software.

5. The method as recited in claim 4, wherein the software:
   simulates the at least one output stage and the electrical circuit, and
   calculates the output signal from the electrical circuit, the output signal being expected for the input signal.

6. The method as recited in claim 1, further comprising:
   determining a type of the error based on the deviation.

7. A device for monitoring at least one output stage that is actuated by a microcontroller using an input signal having a pulse duty factor, comprising:
   an electrical circuit for averaging an output signal from the at least one output stage to produce an averaged value;
   an arrangement including software for calculating from the input signal a setpoint value; and
   an arrangement for comparing the averaged value with the setpoint value, a deviation of the averaged value from the setpoint value indicating an error.

8. The device as recited in claim 7, wherein:
   the electrical circuit includes a passive component.

9. The device as recited in claim 7, wherein:
   the electrical circuit includes at least one resistor and at least one filter.

10. The device as recited in claim 9, wherein:
    the at least one filter includes a low-pass filter.

11. The device as recited in claim 10, wherein:
    the low-pass filter contains capacitors, and
    a capacitance of the capacitors is selected in such a way that the output signal is smoothed out at a switching frequency of the at least one output stage.

12. The device as recited in claim 7, further comprising:
    an arrangement for feeding back the averaged value to an analog input of the microcontroller.

13. The device as recited in claim 10, wherein:
    the at least one resistor is dimensioned so that in no-load operation, a voltage value results at an output of the at least one output stage that corresponds to ¼ of a battery voltage to ¾ of the battery voltage.

14. The device as recited in claim 13, wherein:
in no-load operation, the voltage value resulting at the output of the output stage corresponds to ½ of the battery voltage.

15. The device as recited in claim 7, wherein the software:
stimulates the at least one output stage and the electrical circuit, and
calculates the output signal from the electrical circuit, the output signal being expected for the input signal.

16. The device as recited in claim 7, wherein:
the at least one output stage includes one of a high side output stage and a low side output stage.

\* \* \* \* \*